United States Patent
Bian

(10) Patent No.: US 10,373,945 B2
(45) Date of Patent: Aug. 6, 2019

(54) SEMICONDUCTOR DEVICE HAVING ELECTRO-STATIC DISCHARGE PROTECTION STRUCTURE

(71) Applicant: CSMC TECHNOLOGIES FAB2 CO., LTD., Wuxi New District, Jiangsu (CN)

(72) Inventor: Zheng Bian, Jiangsu (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 15/764,394

(22) PCT Filed: Aug. 24, 2016

(86) PCT No.: PCT/CN2016/096527
§ 371 (c)(1),
(2) Date: Mar. 29, 2018

(87) PCT Pub. No.: WO2017/054595
PCT Pub. Date: Apr. 6, 2017

(65) Prior Publication Data
US 2018/0277532 A1  Sep. 27, 2018

(30) Foreign Application Priority Data
Sep. 30, 2015 (CN) .......................... 2015 1 0641962

(51) Int. Cl.
*H01L 29/16* (2006.01)
*H01L 29/866* (2006.01)
(Continued)

(52) U.S. Cl.
CPC .......... *H01L 27/0255* (2013.01); *H01L 29/16* (2013.01); *H01L 29/866* (2013.01);
(Continued)

(58) Field of Classification Search
CPC .. H01L 29/7801; H01L 27/0255; H01L 29/16
See application file for complete search history.

(56) References Cited

U.S. PATENT DOCUMENTS

| 6,049,112 A | 4/2000 | Allen |
| 6,365,941 B1 | 4/2002 | Rhee |

(Continued)

FOREIGN PATENT DOCUMENTS

| CN | 101982881 A | 3/2011 |
| CN | 103151349 A | 6/2013 |

OTHER PUBLICATIONS

International Search Report with English Translation dated Nov. 30, 2016 issued in corresponding International Application No. PCT/CN2016/096527, pp. 1-9.

*Primary Examiner* — Kenneth Parker
*Assistant Examiner* — Long H Le
(74) *Attorney, Agent, or Firm* — Polsinelli PC

(57) ABSTRACT

A semiconductor device, having an electro-static discharge (ESD) protection structure, comprises: a diode, connected between a gate and a source of the semiconductor device, and comprising a diode main body, and two connection portions, respectively connected to two terminals of the diode main body and respectively electrically connected to the gate and the source; and a substrate comprising two insulation pads disposed thereon and separated from each other. A surface of the substrate between the insulation pads is provided with an insulation layer. The diode main body is arranged on the insulation layer. The two connection portions are configured to extend, respectively, from either end of the diode main body to the insulation pad on the corresponding side. A dielectric layer is arranged on the diode and the two insulation pads, and a metal conduction line layer is arranged on the dielectric layer.

8 Claims, 1 Drawing Sheet

(51) Int. Cl.
*H01L 27/02* (2006.01)
*H01L 27/06* (2006.01)
*H01L 29/78* (2006.01)
*H01L 29/06* (2006.01)

(52) U.S. Cl.
CPC ...... *H01L 27/0629* (2013.01); *H01L 29/0657* (2013.01); *H01L 29/7801* (2013.01)

(56) References Cited

U.S. PATENT DOCUMENTS

| | | | | |
|---|---|---|---|---|
| 2004/0262684 | A1* | 12/2004 | Fragapane | H01L 27/0255 257/341 |
| 2011/0266593 | A1* | 11/2011 | Hsieh | H01L 27/0255 257/139 |
| 2015/0294966 | A1* | 10/2015 | Weyers | H01L 27/0255 257/49 |

* cited by examiner

SEMICONDUCTOR DEVICE HAVING ELECTRO-STATIC DISCHARGE PROTECTION STRUCTURE

CROSS REFERENCE TO RELATED APPLICATIONS

This application is a National Phase filing under 35 U.S.C. § 371 of PCT/CN2016/096527 filed on Aug. 24, 2016, which claims priority to Chinese Patent Application No. 201510641962.X, entitled "SEMICONDUCTOR DEVICE HAVING ELECTRO-STATIC DISCHARGE PROTECTION STRUCTURE" filed on Sep. 30, 2015, the contents of which are expressly incorporated by reference herein in its entirety.

TECHNICAL FIELD

The present disclosure relates to a field of semiconductor manufacture technology, and more particularly relates to a semiconductor device having an electrostatic discharge (ESD) protection structure.

BACKGROUND

The ESD protection structure of a mainstream double diffused metal oxide semiconductor field effect transistor (DMOSFET) device having the ESD protection is achieved by manufacturing a diode on the polysilicon, the structure of which is shown in FIG. 1, and the diode is disposed in parallel between a source and a gate of the device. In order to electrically insulate the diode from other cell circuits, an insulating layer having a certain thickness should be made under the diode on the wafer during fabrication as required, therefore the area is higher than the other tube core areas. As semiconductor processes entering into a smaller linewidth era, the dielectric process of which has also developed into the relatively advanced chemical mechanical polishing (CMP) process. However, there are problems that a thicker dielectric thickness has to be set while performing the CMP process to ensure the process margin for the subsequent process due to high steps in part of areas, thereby sacrificing part of the performances of the tube core and causing the instability of the process itself, simultaneously.

SUMMARY

Accordingly, a semiconductor device having an ESD protection structure is provided, which can address the problem that the conventional process needs to deposit a thicker dielectric layer to perform CMP.

A semiconductor device having the ESD protection structure is provided. The ESD protection structure is a diode coupled between a gate and a source of the semiconductor device. The semiconductor device includes a substrate, a field oxide layer and a gate oxide layer formed on the substrate. The diode includes a diode body and two connecting portions coupled to both ends of the diode body. The two connecting portions are used to be electrically coupled to the gate and the source, respectively. Two insulating pads separated from each other are provided on the substrate. An insulating layer having a thickness less than the two insulating pads is provided on a surface of the substrate which is between the two insulating pads. The diode body is provided on the insulating layer, and the two connecting portions extend respectively from one end of the diode body to the corresponding insulating pad. A dielectric layer is provided on the diode and the two insulating pads, a metal wire layer is provided on the dielectric layer. The metal wire layer includes a first metal leading-out electrically coupled to the gate and a second metal leading-out electrically coupled to the source. The first metal leading-out and the second metal leading-out are respectively coupled to one connecting portion through a contact hole penetrating through the dielectric layer.

According to the aforementioned semiconductor device having the ESD protection structure, the insulating pad which is only under the contact hole is preserved. The different designs are implemented for the different process requirement areas so as to meet the requirement of the minimum thickness of the insulating layer in the metal corrosion area and the hole corrosion area respectively, without the need to adopt a uniform thickness of the insulating layer throughout the device process areas, so as to avoid wastage of the deposited thickness. Thus, the thickness of the entire dielectric layer that needs to be deposited is much thinner, and the difficulty of the process of etching the contact holes in the thick dielectric is also reduced, thereby reducing the cost and simultaneously improving the productivity.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

The present disclosure will be described in details with reference to the accompanying drawings and embodiments such that the purpose, technical solution and advantages of the present disclosure will be more apparent. The various embodiments of the invention may, however, be embodied in many different forms and should not be construed as limited to the embodiments set forth herein. Rather, these embodiments are provided so that this disclosure will be thorough and complete, and will fully convey the scope of the present disclosure to those skilled in the art.

Unless otherwise defined, all terms (including technical and scientific terms) used herein have the same meaning as commonly understood by one of ordinary skill in the art to which this invention belongs. The terminology used herein is for the purpose of describing particular embodiments only and is not intended to be limiting of the invention. It will be further understood that the term "and/or" is understood to encompass various alternative orientations.

Figure 1:
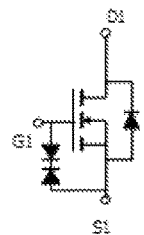
FIG. 1 is a circuit diagram of a semiconductor device having an ESD protection structure.
Figure 2:
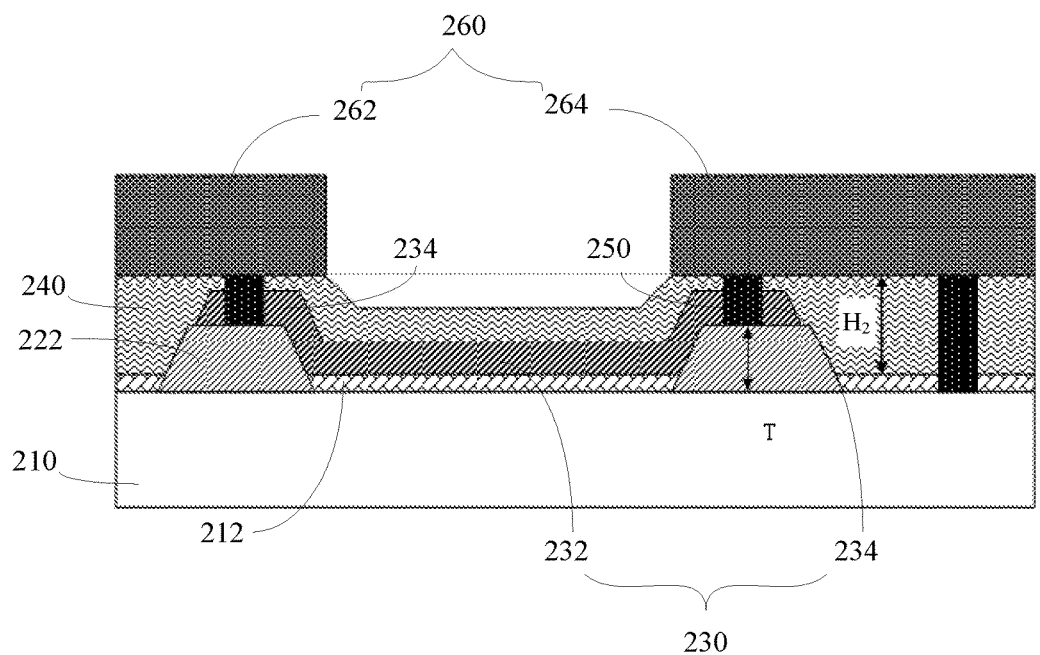
FIG. 2 is a cross-section diagram of a semiconductor device having an ESD protection structure according to an embodiment.

FIG. 2 is a cross-section diagram of a semiconductor device having an ESD protection structure according to an embodiment. As the ESD protection structure, a diode 230 includes a diode body 232 and two connecting portions 234 coupled to both ends of the diode body 232. The two connecting portions 234 are used to be electrically coupled to the gate (not shown in FIG. 2) and the source (not shown in FIG. 2), respectively. In the illustrated embodiment, the diode 230 is made of polysilicon, i.e., the diode body 232 and the connecting portion 234 are made of polysilicon. N-type and P-type impurities are doped into the diode body 232 to form a PN junction. In alternative embodiments, the diode 230 can also be made of other materials known in the art which are suitable for manufacturing the diode. Two insulating pads 222 separated from each other are provided on the substrate 210 of the semiconductor device. An insulating layer 212 having a thickness less than the two insulating pads 222 is provided on a surface of the substrate which is between the two insulating pads 222. The diode body 232 is provided on the insulating layer 212, and the two connecting portions 234 extend respectively from one end of the diode body 232 to the corresponding insulating pad 222, i.e., the left connecting portion 234 extends to the left insulating pad 222 of the diode body 232, and the right connecting portion 234 extends to the insulating pad 222 of the diode body 232. A dielectric layer 240 with insulating function is provided on the diode 230 and the two insulating pads 222, and a metal wire layer 260 is provided on the dielectric layer 240. The metal wire layer 260 includes a first metal leading-out 262 electrically coupled to the gate and a second metal leading-out 264 electrically coupled to the source. The first metal leading-out 262 and the second metal leading-out 264 are respectively coupled to one connecting portion 234 through a contact hole 250 (the contact hole 250 is filled with a conductive substance, usually metal) penetrating through the dielectric layer 240. The insulating pads 222 serves as an etch stop layer of the contact hole 250, which can prevent the contact hole 250 from being etched into the substrate due to process variations.

Comparing to the field oxide layer under the conventional simple continuous integrated polysilicon 130, the insulating pad which is only under the lead-out hole (contact hole 250) is preserved in the aforementioned semiconductor device having the ESD protection structure. The different designs are adopted for the different process requirement areas so as to meet the requirement of the minimum thickness of the insulating layer in the metal corrosion area and the hole corrosion area respectively. There is no need to adopt a uniform thickness of the insulating layer throughout the device process areas, so as to avoid wastage of the deposited thickness. Under the premise of keeping a stop thickness T of the insulating pad 222 serving as the etch stop layer of the contact hole 250 the same as that in the conventional structure, a thickness H2 of the dielectric layer 240 can be made thinner than the conventional structure while a thickness of the dielectric layer 240 overlying the diode body 232 is thicker than conventional structure. Comparing to the conventional structure, the thickness of the entire dielectric layer that needs to be deposited is much thinner, and the processing difficulty of etching the contact holes in the thick dielectric is also reduced (since the depth of the contact hole is also reduced accordingly). In addition, the cost is reduced and the productivity is improved, simultaneously. The approximate CMP process implemented in the basic process can be used based on the assurance of the subsequent process margin, thereby reducing the thickness cost of the pre-deposition of the dielectric process while reducing the thickness of the dielectric and ensuring the process stability. And while reducing H2, the thickness of the dielectric layer 240 overlying the diode body 232 can be increased, thereby reducing the reliability risk caused by polycrystalline exposure due to over-etch of the metal corrosion.

It should be noted that the diode body 232 is led out through the metal leading-out of the contact hole 250 above the connecting portions 234 of both sides, and the connecting portion 234 only serves as an electrical connection. Therefore, even if the dielectric layer 240 on the diode body 232 becomes thinner or the connecting portions 234 are damaged by metal etching, the performances of the device will not be affected.

According to an embodiment, the dielectric layer 240 should be subjected to CMP process, i.e., a thicker thickness is deposited firstly, and then part of the dielectric layer is polished by a planarization process of CMP to flat the surface of the device.

According to the aforementioned semiconductor device having the ESD protection structure, the thickness of the dielectric layer 240 is reduced by optimizing structure to ensure that the CMP process can be compatible with a general CMP process for online process control. Comparing to the conventional structure, the production process costs can be significantly reduced and the difficulty of a single process can be reduced to improve productivity and yield, which is more suitable for the production process implementing CMP technology. In addition, comparing to the conventional flattening process, the CMP technology is more suitable for processing products with small line width, which is beneficial to improve integration level of the device and process yields.

According to the embodiment illustrated in FIG. 2, the insulating layer 212 deposited between the two insulating pads 222 is part of the gate oxide layer, i.e., the silicon dioxide formed at the corresponding position is used as the insulating layer 212 when the gate oxide layer of the semiconductor device is formed. The insulating pad 222 is part of the field oxide layer, i.e., the silicon dioxide formed at the corresponding position is used as the insulating pad 222 (a large field oxide can be formed firstly, and then two separated insulating pads 222 are formed by etching) when the field oxide layer of the semiconductor device is formed. The field oxide layer or gate oxide layer is used as the insulating layer 212 or insulating pad 222, which can save process and costs, and improve production efficiency.

According to the embodiment illustrated in FIG. 2, the contact holes 250 are filled with tungsten as a conductive substance. In alternative embodiments, other materials known in the art, such as metals and alloys, which are suitable as conductive fillers of the contact hole, can also be used.

According to the embodiment illustrated in FIG. 2, the semiconductor device is a double diffused metal oxide semiconductor field effect transistor (DMOSFET).

According to the embodiment illustrated in FIG. 2, the dielectric layer 240 above the diode body 232 is depressed downwardly by over etching the metal wire layer 260, so as to ensure that there is no metal residue.

According to an embodiment, the diode 230 is a Zener diode. In an alternative embodiment, other types of diodes may also be used for the diode 230.

Although the invention is illustrated and described herein with reference to specific embodiments, the invention is not intended to be limited to the details shown. It should be noted that any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. A semiconductor device having an electrostatic discharge (ESD) protection structure, wherein the ESD protection structure is a diode coupled between a gate and a source of the semiconductor device, the semiconductor device comprises a substrate, a field oxide layer and a gate oxide layer formed on the substrate, the diode comprises a diode body and two connecting portions coupled to both ends of the diode body, the two connecting portions are configured to be electrically coupled to the gate and the source, respectively; two insulating pads separated from each other are provided on the substrate, an insulating layer having a thickness less than the two insulating pads is provided on a surface of the substrate which is between the two insulating pads, the diode body is provided on the insulating layer, and the two connecting portions extend respectively from one end of the diode body to the corresponding insulating pad; a dielectric layer is provided on the diode and the two insulating pads, a metal wire layer is provided on the dielectric layer, the metal wire layer comprises a first metal leading-out electrically coupled to the gate and a second metal leading-out electrically coupled to the source, and the first metal leading-out and the second metal leading-out are respectively coupled to one connecting portion through a contact hole penetrating through the dielectric layer.

2. The semiconductor device having the ESD protection structure of claim 1, wherein the two insulating pads are part of the field oxide layer.

3. The semiconductor device having the ESD protection structure of claim 1, wherein the insulating layer is part of the gate oxide layer.

4. The semiconductor device having the ESD protection structure of claim 1, wherein the dielectric layer is a dielectric layer subjected to a chemical mechanical polishing (CMP) process.

5. The semiconductor device having the ESD protection structure of claim 1, wherein two contact holes are filled with tungsten as a conductive substance.

6. The semiconductor device having the ESD protection structure of claim 1, wherein the semiconductor device is a double diffused metal oxide semiconductor field effect transistor.

7. The semiconductor device having the ESD protection structure of claim 1, wherein the diode is made of polysilicon, and the diode body is doped with N-type impurities and P-type impurities.

8. The semiconductor device having the ESD protection structure of claim 1, wherein a surface of the dielectric layer above the diode body is depressed downwardly.

* * * * *